(12) United States Patent
Song et al.

(10) Patent No.: US 10,985,213 B2
(45) Date of Patent: Apr. 20, 2021

(54) NONVOLATILE MEMORY DEVICE

(71) Applicant: SAMSUNG ELECTRONICS CO., LTD., Suwon-si (KR)

(72) Inventors: Si-Ho Song, Hwasung-si (KR); Youngbae Kim, Hwasung-si (KR); Dueung Kim, Hwasung-si (KR); Changhyun Cho, Hwasung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/780,014

(22) Filed: Feb. 3, 2020

(65) Prior Publication Data

US 2020/0381478 A1 Dec. 3, 2020

(30) Foreign Application Priority Data

May 29, 2019 (KR) ........................ 10-2019-0063329

(51) Int. Cl.
*H01L 27/24* (2006.01)
*G11C 13/00* (2006.01)
*H01L 45/00* (2006.01)

(52) U.S. Cl.
CPC .......... *H01L 27/249* (2013.01); *G11C 13/004* (2013.01); *G11C 13/0004* (2013.01);
(Continued)

(58) Field of Classification Search
CPC . H01L 27/249; H01L 27/2418; H01L 45/143; H01L 45/146; H01L 45/147; H01L 45/06; H01L 45/144; H01L 27/2427; G11C 13/0026; G11C 13/0038; G11C 13/0004; G11C 13/0007; G11C 13/004; G11C 13/0097; G11C 13/0028; G11C 2213/32; G11C 2213/71; G11C 2213/31
See application file for complete search history.

(56) References Cited

U.S. PATENT DOCUMENTS 7,830,706 B2 11/2010 Hanzawa et al.
7,911,854 B2 3/2011 Nagashima et al.
(Continued)

FOREIGN PATENT DOCUMENTS

JP 2009-211735 9/2009
JP 5063337 10/2012
(Continued)

*Primary Examiner* — Tri M Hoang
(74) *Attorney, Agent, or Firm* — F. Chau & Associates, LLC

(57) ABSTRACT

A nonvolatile memory device includes a memory cell array, a word line drive block that is connected to a first group of memory cells through a first group of word lines and to a second group of memory cells through a second group of word lines, a bit line bias and sense block that is connected to the first and second groups of memory cells through bit lines, a variable current supply block that generates a word line current to be supplied to a selected word line, and a control logic block that receives an address and a command and controls the variable current supply block to adjust an amount of the word line current based on the address. The control logic block further varies the amount of the word line current depending on a distance between the selected word line and the substrate.

20 Claims, 8 Drawing Sheets

(52) U.S. Cl.
CPC ...... *G11C 13/0007* (2013.01); *G11C 13/0026* (2013.01); *G11C 13/0028* (2013.01); *G11C 13/0038* (2013.01); *G11C 13/0097* (2013.01); *H01L 27/2418* (2013.01); *H01L 27/2427* (2013.01); *H01L 45/06* (2013.01); *H01L 45/143* (2013.01); *H01L 45/144* (2013.01); *H01L 45/146* (2013.01); *H01L 45/147* (2013.01); *G11C 2213/31* (2013.01); *G11C 2213/32* (2013.01); *G11C 2213/71* (2013.01)

(56) References Cited

U.S. PATENT DOCUMENTS

| | | | |
|---|---|---|---|
| 7,996,735 | B2 | 8/2011 | Terao et al. |
| 8,587,052 | B2* | 11/2013 | Yun .................. H01L 27/11582 257/324 |
| 8,642,985 | B2* | 2/2014 | Chen .................. H01L 27/2418 257/1 |
| 8,742,493 | B2* | 6/2014 | Kim .................. H01L 29/1087 257/330 |
| 8,929,124 | B2 | 1/2015 | Kim et al. |
| 9,361,978 | B2 | 6/2016 | Shiramizu et al. |
| 9,721,964 | B2* | 8/2017 | Lee .................. H01L 29/40117 |
| 2009/0219750 | A1 | 9/2009 | Tokiwa et al. |
| 2011/0300686 | A1* | 12/2011 | Chae .................. H01L 27/101 438/382 |
| 2012/0299082 | A1* | 11/2012 | Park .................. H01L 27/11582 257/319 |
| 2013/0016557 | A1 | 1/2013 | Kim |
| 2019/0393270 | A1* | 12/2019 | Kim .................. H01L 45/06 |

FOREIGN PATENT DOCUMENTS

| | | |
|---|---|---|
| JP | 5188328 | 4/2013 |
| JP | 5886974 | 3/2016 |
| JP | 2017-107626 | 6/2017 |
| KR | 10-1015325 | 2/2011 |

* cited by examiner

NONVOLATILE MEMORY DEVICE

CROSS-REFERENCE TO RELATED APPLICATION

This application claims priority under 35 U.S.C. § 119 to Korean Patent Application No. 10-2019-0063329 filed on May 29 2019, in the Korean Intellectual Property Office, the disclosure of Which. is incorporated by reference herein in its entirety.

TECHNICAL FIELD

Exemplary embodiments of the inventive concept relate to a semiconductor device, and more particularly, to a nonvolatile semiconductor memory that performs a set operation or a reset operation based on process variations.

DISCUSSION OF RELATED ART

A nonvolatile memory device is a type of computer memory that can retrieve stored information even after having been power cycled. As an example, a nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), resistive RAM (RRAM), a ferroelectric RAM (FRAM), etc.

As semiconductor manufacturing technologies develop, the degree of integration and capacity of the nonvolatile memory device continue to increase. One particular way to increase the degree of integration and the capacity of the nonvolatile memory device has been to use memory cells with a three-dimensional structure.

Accordingly, there is a need to increase the reliability of the memory cells in the three-dimensional structure.

SUMMARY

According to an exemplary embodiment of the inventive concept, a nonvolatile memory device includes: a memory cell array including a first group of memory cells and a second group of memory cells; a word line drive block connected to the first group of memory cells through a first group of word lines and to the second group of memory cells through a second group of word lines; a bit line bias and sense block connected to the first group of memory cells and the second group of memory cells through bit lines; a variable current supply block configured to generate a word line current to be supplied to a word line selected from the first group of word lines or the second group of word lines; and a control logic block configured to receive an address and a command from an external host device and to control the variable current supply block to adjust an amount of the word line current based on the address, wherein the memory cell array includes: a substrate including an upper surface corresponding to a plane defined by a first direction and a second direction; vertical conductive materials spaced from each other along the second direction, wherein the vertical conductive materials extend in a third direction perpendicular to the first direction and the second direction, and correspond to the bit lines; first insulating layers and first memory cells stacked along the third direction on first side surfaces of the vertical conductive materials; first conductive materials extending along the second direction on first side surfaces of the first memory cells, wherein the first conductive materials correspond to the first group of word lines; second insulating layers and second. memory cells stacked along the third direction on second side surfaces of the vertical conductive materials; and second conductive materials extending along the second direction on second side surfaces of the second memory cells, wherein the second conductive materials correspond to the second group of word lines, and wherein the control logic block is further configured to vary the amount of the word line current depending on a distance between the selected word line and the substrate.

According to an exemplary embodiment of the inventive concept, a nonvolatile memory device includes: a memory cell array including a first group of memory cells and a second group of memory cells; a word line drive block connected to the first group of memory cells through a first group of word lines and to the second group of memory cells through a second group of word lines; a bit line bias and sense block connected to the first group of memory cells and the second group of memory cells through bit lines; a variable current supply block configured to generate a word line current to be supplied to a word line selected from the first group of word lines or the second group of word lines; and a control logic block configured to receive an address and a command from a host device and to control the variable current supply block to adjust an amount of the word line current based on the address, wherein the memory cell array includes: a substrate including an upper surface corresponding to a plane defined by a first direction and a second direction; vertical conductive materials spaced from each other along the second direction, wherein the vertical conductive materials extend in a third direction perpendicular to the first direction and the second direction, and correspond to the bit lines; first insulating layers and first memory cells alternately stacked along the third direction on first side surfaces of the vertical conductive materials; first conductive materials extending along the second direction on first side surfaces of the first memory cells, wherein the first conductive materials correspond to the first group of word lines; second insulating layers and second memory cells alternately stacked along the third direction on second side surfaces of the vertical conductive materials; and second conductive materials extending along the second direction on second side surfaces of the second memory cells, wherein the second conductive materials correspond to the second group of word lines, and wherein the control logic block is further configured to vary the amount of the word line current depending on a cross-sectional area of at least one of the bit lines disposed at a same height as the selected word line.

According to an exemplary embodiment of the inventive concept, a nonvolatile memory device includes: a memory cell array including a first group of memory cells and a second group of memory cells; a word line drive block connected to the first group of memory cells through a first group of word lines and to the second group of memory cells through a second group of word lines; a bit line bias and sense block connected to the first group of memory cells and the second group of memory cells through bit lines; a variable current supply block configured to generate a word line current to be supplied to a word line selected from the first group of word lines or the second group of word lines; and a control logic block configured to receive an address and a command from a host device and to control the variable current supply block to adjust an amount of the word line current based on the address, wherein the memory cell array includes: a substrate including an upper surface arranged in a first direction and a second direction; vertical conductive materials spaced from each other along the second direction, wherein the vertical conductive materials extend in a third direction perpendicular to the first direction and the second direction, and correspond to the bit lines; first insulating layers and first memory cells stacked along the third direction on first side surfaces of the vertical conductive materials; first conductive materials extending along the second direction on first side surfaces of the first memory cells, wherein the first conductive materials correspond to the first group of word lines; second insulating layers and second memory cells stacked along the third direction on second side surfaces of the vertical conductive materials; and second conductive materials extending along the second direction on second side surfaces of the second memory cells, wherein the second conductive materials correspond to the second group of word lines, and wherein the control logic block is further configured to vary the amount of the word line current depending on a size of the memory cells connected to the selected word line.

BRIEF DESCRIPTION OF THE FIGURES

The above and other features of the inventive concept will become apparent by describing in detail exemplary embodiments thereof with reference to the accompanying drawings.

DETAILED DESCRIPTION OF THE EMBODIMENTS

Figure 1:
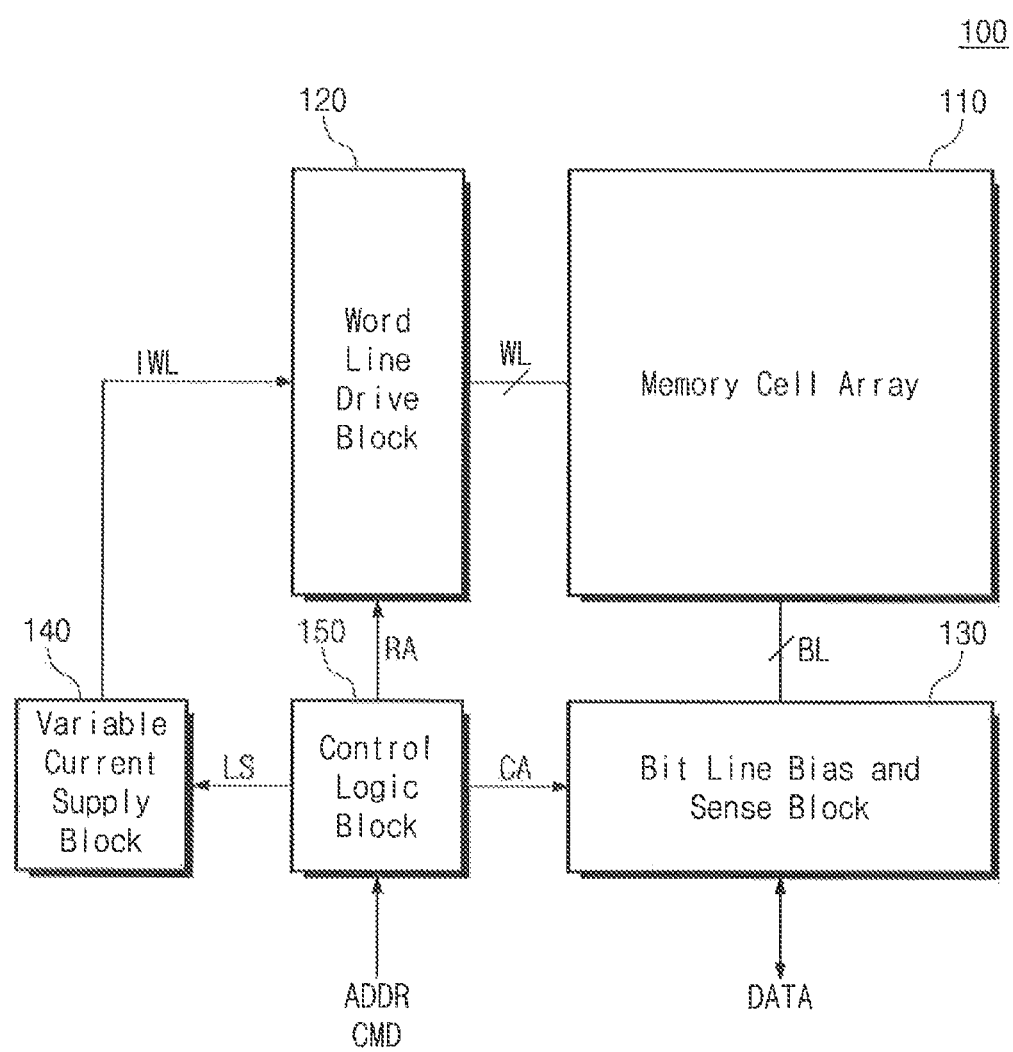
FIG. 1 is a block diagram illustrating a nonvolatile memory device according to an exemplary embodiment of the inventive concept.

FIG. 1 is a block diagram illustrating a nonvolatile memory device 100 according to an exemplary embodiment of the inventive concept. Referring to FIG. 1, the nonvolatile memory device 100 may include a memory cell array 110, a word line drive block 120, a bit line bias and sense block 130, a variable current supply block 140, and a control logic block 150.

The memory cell array 110 may be connected to the word line drive block 120 through word lines WL and may be connected to the bit line bias and sense block 130 through bit lines BL. The memory cell array 110 may include memory cells arranged in a three-dimensional structure.

The word line drive block 120 is connected to the memory cell array 110 through the word lines WL. The word line drive block 120 may receive a row address RA from the control logic block 150. The word line drive block 120 may select one of the word lines WL based on the row address RA.

The word line drive block 120 may receive a word line current IWL from the variable current supply block 140. In a set operation, a reset operation, or a read operation, the word line drive block 120 may apply the word line current IWL to a selected word line.

The bit line bias and sense block 130 is connected to the memory cell array 110 through the bit lines BL. The bit line bias and sense block 130 may receive a column address CA from the control logic block 150. The bit line bias and sense block 130 may select some bit lines of the bit lines BL based on the column address CA.

In the set operation or the reset operation, the bit line bias and sense block 130 may receive data "DATA" from an external device and may supply voltages for the set operation or the reset operation to the selected bit lines.

In the read operation, the bit line bias and sense block 130 may sense voltages or currents of the selected bit lines and may store digitized data "DATA" as a sensing result. The bit line bias and sense block 130 may output the stored data "DATA" to the external device.

The variable current supply block 140 may supply the word line current IWL to the word line drive block 120. The variable current supply block 140 may receive a level signal LS front the control logic block 150. The variable current supply block 140 may adjust the amount of the word line current IWL in response to the level signal LS.

The control logic block 150 may receive an address ADDR and a command CMD from the external device. The control logic block 150 may extract the row address RA from the address ADDR and may transfer the row address RA to the word line drive block 120. In addition, the control logic block 150 may extract the column address CA from the address ADDR and may transfer the column address CA to the bit line bias and sense block 120.

The control logic block 150 may control the word line drive block 120, the bit line bias and sense block 130, and the variable current supply block 140 to perform the set operation, the reset operation, and the read operation. The control logic block 150 may control the variable current supply block 140 by using the level signal LS to adjust the amount of the word line current IWL.

In an exemplary embodiment of the inventive concept, the variable current supply block 140 is illustrated as an independent block that is separated from the memory cell array 110, the word line drive block 120, the bit line bias and sense block 130, and the control logic block 150. However, the variable current supply block 140 may be included in the memory cell array 110, the word line drive block 120, the bit line bias and sense block 130, and/or the control logic block 150. The word line drive block 120, the bit line and bias sense block 130, the variable current supply block 140 and the control logic block 150 may be implemented by electronic circuits.

Figure 2:
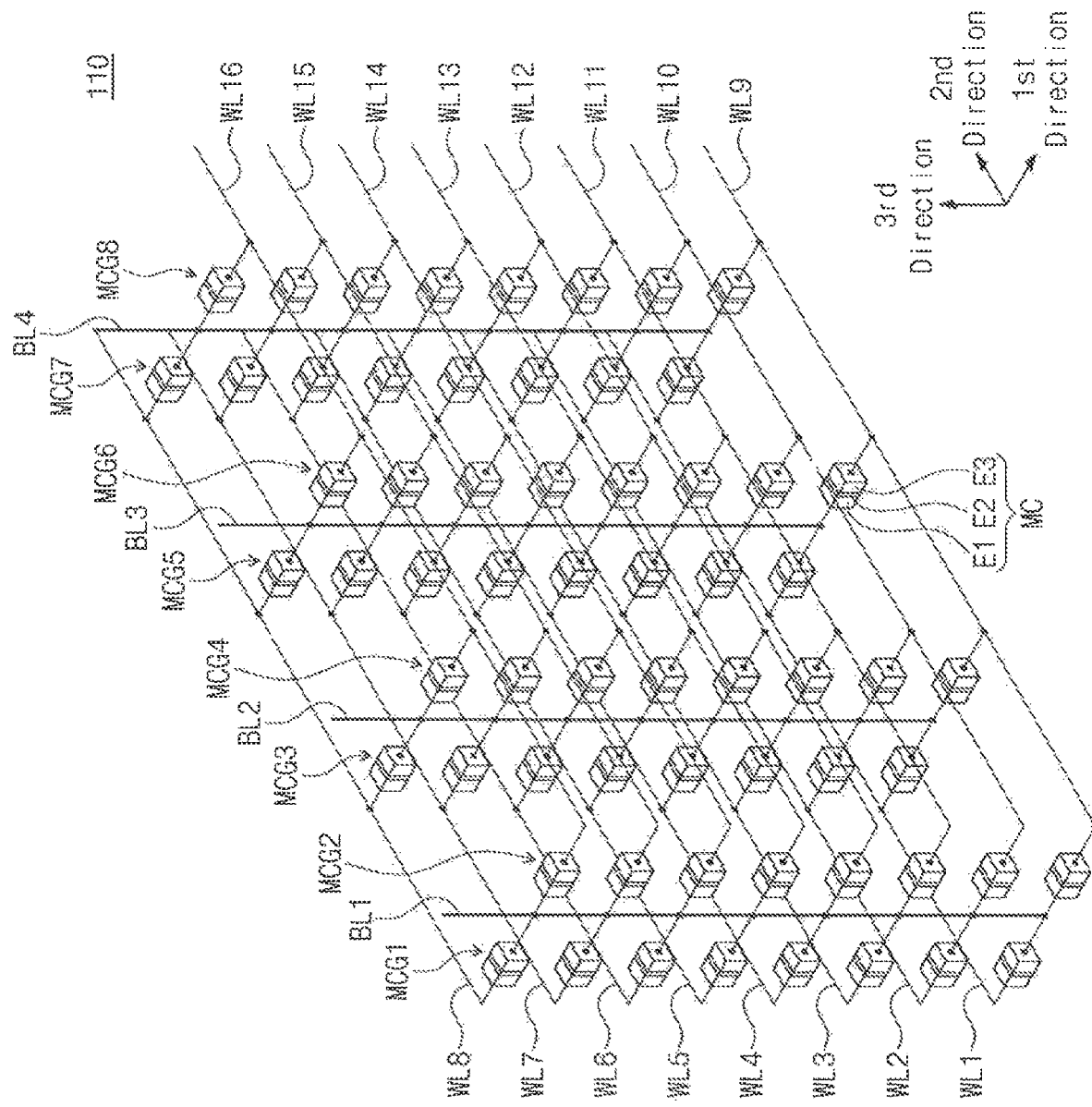
FIG. 2 illustrates a portion of a memory cell array of FIG. 1 according to an exemplary embodiment of the inventive concept.

FIG. 2 is a circuit diagram illustrating a portion of the memory cell array 110 of FIG. 1, according to an exemplary embodiment of the inventive concept. In an exemplary embodiment of the inventive concept, it is assumed that the memory cell array 110 includes phase change memory cells. However, the memory cell array 110 is not limited thereto and may include resistive memory cells, for example. Referring to FIGS. 1 and 2, the memory cell array 110 may include a first group of memory cells MCG1, a second group of memory cells MCG2, a third group of memory cells MCG3, a fourth group of memory cells MCG4, a fifth group of memory cells MCG5, a sixth group of memory cells MCG6, a seventh group of memory cells MCG7, and an eighth group of memory cells MCG8.

The first to eighth groups of memory cells MCG1 to MCG8 may be arranged in rows and columns along a first direction and a second direction. The n-th and (n+1)-th groups of memory cells (n being an odd integer of 1 or more and 7 or less) arranged along the first direction may form one row. The first, third, fifth, and seventh groups of memory cells MCG1, MCG3, MCG5, and MCG7 arranged along the second direction may form one column, and the second, fourth, sixth, and eighth groups of memory cells MCG2, MCG4, MCG6, and MCG8 arranged along the second direction may form another column.

The k-th group of memory cells MCGk (k being an integer of 1 or more and 8 or less) may include memory cells MC that are stacked along a third direction perpendicular to the first direction and the second direction. A bit line may be provided between the n-th and (n+1)-th groups of memory cells (n being an odd integer of 1 or more and 7 or less). For example, first, second, third and fourth bit lines BL1, BL2, BL3 and BL4 that extend along the third direction may be provided between the first to eighth groups of memory cells MCG1 to MCG8. The first to fourth bit lines BL1 to BL4 may be a part of the bit lines BL of FIG. 1.

The nth and (n+1)-th groups of memory cells (n being an odd integer of 1 or more and 7 or less) may be connected in common to the corresponding bit line (e.g., the i-th bit line (i being a quotient obtained by dividing (n+1) by 2)). The first, third, fifth, and seventh groups (e.g., odd-numbered groups) of memory cells MCG1, MCG3, MCG5, and MCG7 may be connected in common to first, second, third, fourth, fifth, sixth, seventh and eighth word lines WL1, WL2, WL3, WL4, WL5, WL6, WL7 and WL8 (e.g., a first group of word lines) extending along the second direction.

The second, fourth, sixth, and eighth groups (e.g., even-numbered groups) of memory cells MCG2, MCG4, MCG6, and MCG8 may be connected in common to ninth, tenth, eleventh, twelfth, thirteenth, fourteenth, fifteenth and sixteenth word lines WL9, WL10, WL11, WL12, WL13, WL14, WL15 and WL16 (e.g., a second group of word lines) extending along the second direction.

In the k-th group of memory cells MCGk, memory cells having different heights (e.g., a height in the third direction) may be connected to different word lines. In the odd-numbered groups of memory cells MCG1, MCG3, MCS, and MCG7, memory cells of the same height may be connected to the same word line. In the even-numbered groups of memory cells MCG2, MCG4, MCG6, and MCG8, memory cells of the same height may be connected to the same word line.

Each of the memory cells MC may include a first element E1 connected to the corresponding bit line, a third element E3 connected to the corresponding word line, and a second element E2 interposed between the first element E1 and the third element E3. The first element E1 may include, a phase change element or a selection element. The second element E2 may include a barrier element. The third element E3 may include the selection element or the phase change element.

The phase change element may include a material, the phase of which reversibly changes between a crystalline state and an amorphous state depending on a temperature. The phase change element may include a compound of at least one of Te and Se being a chalcogen element and at least one of Ge, Sb, Bi, Pb. Sn, Ag, As, S, Si, In, Ti, Ga, P, O, and C.

For example, the phase change element may include at least one of GeSbTe, GeTeAs, SbTeSe, GeTe, SbTc, SeTeSn, GeTeSe, SbSeBi, GeBiTe, GeTeTi, InSe, GaTeSe, and InSbTe. As another example, the phase change element may have a superlattice structure in which a layer including Ge and a layer not including Ge are repeatedly stacked (e.g., a structure in which a GeTe layer and a SbTe layer are repeatedly stacked).

According to other exemplary embodiments of the inventive concept, the phase change element may include perovskite compounds or conductive metal oxides. The phase change element may have a dual structure of a conductive metal oxide layer and a tunnel insulating layer or may have a triple structure of a conductive metal oxide layer, a tunnel insulating layer, and a second conductive metal oxide layer. In this case, the tunnel insulating layer may include an aluminum oxide, a hafnium oxide, or a silicon oxide.

The selection element may include a switch element that selectively operates as a conductor or an insulator depending on a voltage or a current applied to the selection element. The selection element may include an ovonic threshold switching (OTS) material. For example, the selection element may include a chalcogenide switching material as the OTS material.

The selection element may include the chalcogenide switching material including arsenic (As) and selenium (Se) and may further include an additive element. The additive element may include, for example, at least one of boron (B), carbon (C), nitrogen (N), oxygen (O), and phosphorus (P). The selection element may include, for example, GeSe, AsGeSe, GeAsSeTc, GeAsTe, SiAsGeSe, or SiAsGeTe.

In another exemplary embodiment of the inventive concept, the selection element may include an oxide diode. The oxide diode may include an n-type oxide layer and a p-type oxide layer. The p-type oxide layer may include, for example, at least one of InZn oxide, InSn oxide, Zn oxide, Sn oxide, and Ti oxide.

The p-type oxide layer may include, for example, at least one of Cu oxide, Ni oxide, CuAl oxide, ZnRh oxide, and SrCu oxide. In another exemplary embodiment of the inventive concept, the selection element may include a transition metal oxide. For example, the selection element may include at least one of NiO, ZnO, HfO, and TaO.

The barrier element may prevent metal diffusion between the phase change element and the selection element and may decrease a contact resistance between the phase change element and the selection element. The barrier element may include, for example, at least one of carbon, TiN, TiSiN, $WSi_x$ (x being a positive integer), and WN.

In an exemplary embodiment of the inventive concept, 64 memory cells MC, 16 word lines WL1 to WL16, and four bit lines BL1 to BL4 are illustrated in FIG. 1. However, the structure of the memory cell array 110 is not limited to the example illustrated in FIG. 2, For example, when more memory cells are provided along the second direction, the number of bit lines may increase. In addition, when more memory cells are provided along the third direction, the number of word lines may increase. Further, the structure illustrated in FIG. 2 may be repeatedly disposed along the first direction.

Figure 3:
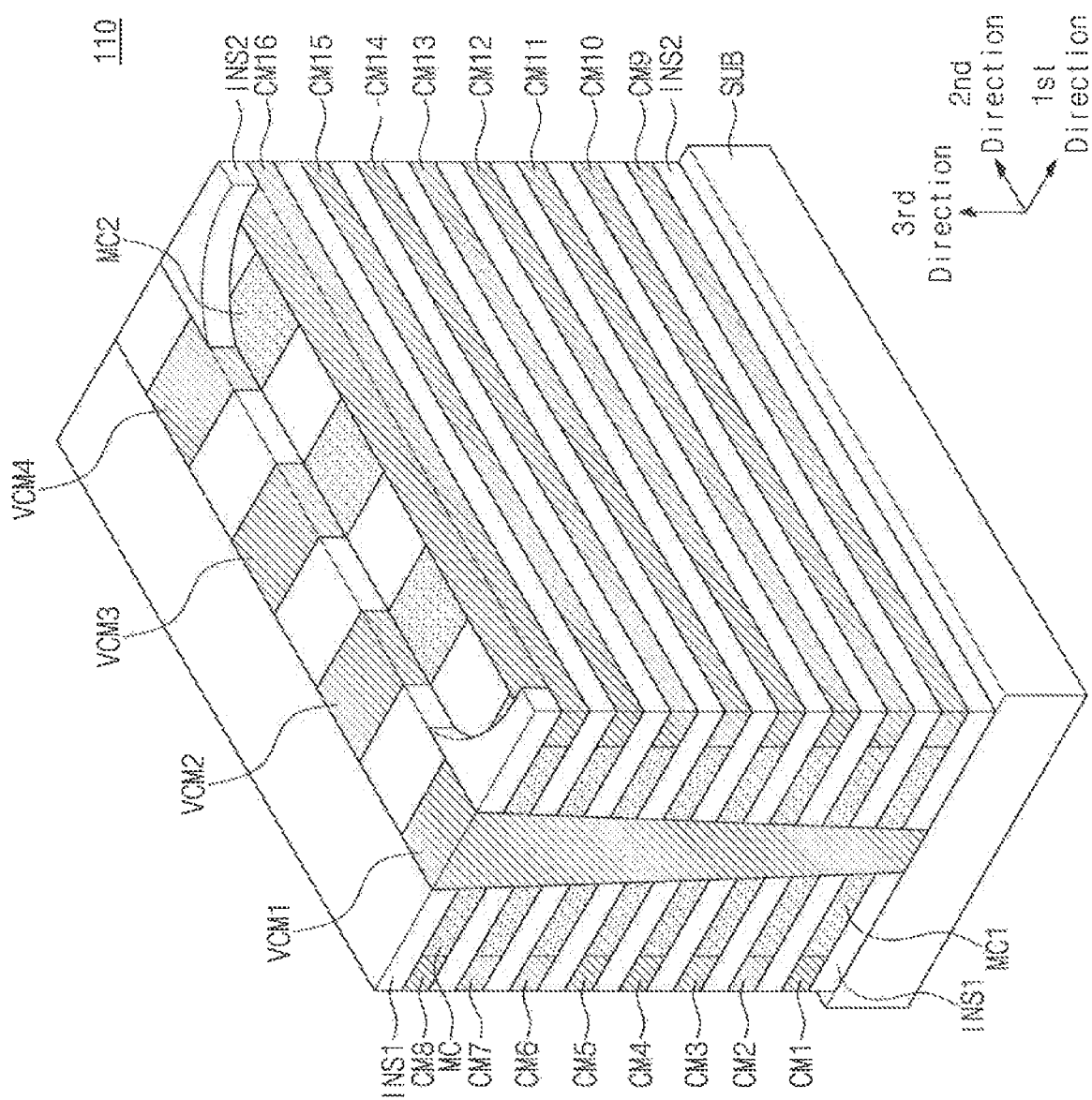
FIG. 3 is a perspective cross-sectional view illustrating a structure of a memory cell array of FIG. 2 according to an exemplary embodiment of the inventive concept.

FIG. 3 is a perspective cross-sectional view illustrating a structure of the memory cell array 110 of FIG. 2, according to an exemplary embodiment of the inventive concept. Referring to FIGS. 1, 2, and 3, a substrate SUB may be provided which has an upper surface corresponding to a plane defined by the first direction and the second direction. First, second, third and fourth vertical conductive materials VCM1, VC2, VC3 and VCM4 that are spaced from each other along the second direction and extend in the third direction perpendicular to the first direction and the second direction are provided on the substrate SUB. The first to fourth vertical conductive materials VCM1 to VCM4 may respectively correspond to the first to fourth bit lines BL1 to BL4. The first to fourth vertical conductive materials VCM1 to VCM4 may widen as they move away from the upper surface of the substrate SUB in the third direction.

First insulating layers INS1 and first memory cells MC1 may be alternately stacked along the third direction on side surfaces of the first to fourth vertical conductive materials VCM1 to VCM4, which face away from the first direction. The first memory cells MC1 may correspond to the odd-numbered groups of memory cells MCG1, MCG3, MCG5, and MCG7.

First, second, third, fourth, fifth, sixth, seventh and eighth conductive materials CM1, CM2, CM3, CM4, CM5, CM6, CM7 and CM8 that extend along the second direction may be provided on side surfaces of the first memory cells MC1, which face away from the first direction. The first to eighth conductive materials CM1 to CM8 may respectively correspond to the first to eighth word lines WL1 to WL8. The first insulating layers INS1 may extend along a plane defined by the first direction and the second direction, with a height in the third direction maintained.

Second insulating layers INS2 and second memory cells MC2 may be alternately stacked along the third direction on side surfaces of the first to fourth vertical conductive materials VCM1 to VCM4, which face in the first direction. In other words, the second insulating layers INS2 and the second memory cells MC2 are disposed on a second side of the first to fourth vertical conductive materials VCM1 to VCM4 which is opposite to a first side of the first to fourth vertical conductive materials VCM1 to VCM4 where the first insulating layers INS1 and the first memory cells MC1 are disposed. The second memory cells MC2 may correspond to the even-numbered groups of memory cells MCG2, MCG4, MCG6, and MCG8.

Ninth, tenth, eleventh, twelfth, thirteenth, fourteenth, fifteenth and sixteenth conductive materials CM9, CM10, CM11, CM12, CM13, CM14, CM15 and CM16 that extend along the second direction may be provided on side surfaces of the second memory cells MC2, which face in the first direction. The ninth to sixteenth conductive materials CM9 to CM16 may respectively correspond to the ninth to sixteenth word lines WL9 to WL16. The second insulating layers INS2 may extend along a plane defined by the first direction and the second direction, with a height in the third direction maintained.

A second insulating layer, which corresponds to the last layer (or the uppermost layer) in the third direction, from among the second insulating layers INS2 is illustrated in a cut out state for the purpose of showing the structure of the memory cell array 110 more easily. It is to be understood, however, that the second insulating layer corresponding to the last layer in the third direction is provided in the shape of a plane like the first insulating layer corresponding to the last layer in the third direction.

In the process of manufacturing the memory cell array 110, an initial structure may be manufactured by alternately stacking insulating layers and sacrificial layers on the substrate SUB. Afterwards, holes for the first to fourth vertical conductive materials VCM1 to VCM4 may be formed to pass through the initial structure. Afterwards, the sacrificial layers may be removed, and the first memory cells MC1 and the second memory cells MC2 may be formed in spaces where the sacrificial layers are removed.

A penetration force for penetrating the initial structure decreases as the height in the third direction decreases. Accordingly, as illustrated in FIG. 3, the first to fourth vertical conductive materials VCM1 to VCM4 are gradually tapered. For example, the cross-sectional area of the first to fourth vertical conductive materials VCM1 to VCM4 (e.g., the cross-sectional area defined by the first direction and the second direction) decreases as the height in the third direction or a distance from the substrate SUB decreases. In the alternative, the cross-sectional area of the first to fourth vertical conductive materials VCM1 to VCM4 increases as the height in the third direction or the distance from the substrate SUB increases.

Accordingly, spaces for the first and second memory cells MC1 and MC2 (e.g., the sizes of the first and second memory cells MC1 and MC2) increase as the height in the third direction or the distance from the substrate SUB decreases and decrease as the height in the third direction or the distance from the substrate SUB increases. In other words, first memory cells MC1 near the substrate SUB are larger than first memory cells MC1 near the uppermost first insulating layer INS1.

As described with reference to FIG. 2, each of the memory cells MC including the first and second memory cells MC1 and MC2 includes the first to third elements E1 to E3. In the case where the spaces for the first and second memory cells MC1 and MC2 increase, spaces for the phase change element of the first to third elements E1 to E3 increase, In addition, in the case where the spaces for the first and second memory cells MC1 and MC2 decrease, the spaces for the phase change element of the first to third elements E1 to E3 decrease.

Figure 4:
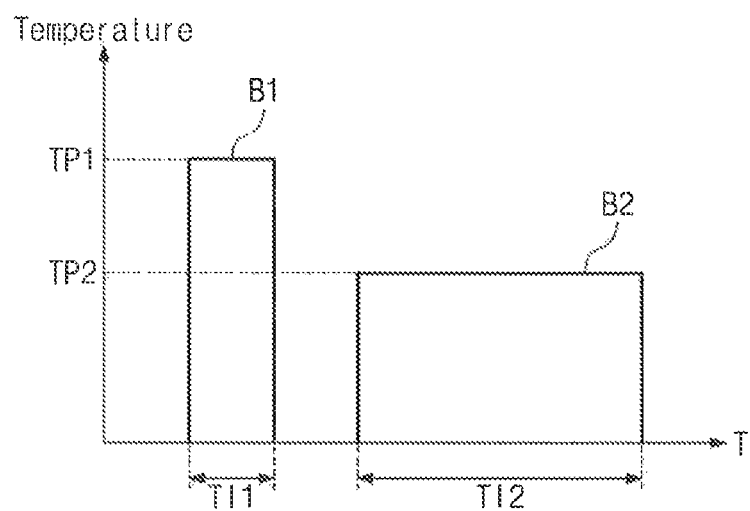
FIG. 4 illustrates conditions for performing a set operation and a reset operation on first and second memory cells according to an exemplary embodiment of the inventive concept.

FIG. 4 illustrates conditions for performing a set operation and a reset operation on the first and second memory cells MC1 and MC2, according to an exemplary embodiment of the inventive concept. In FIG. 4, a horizontal axis represents a time "T", and a vertical axis represents a temperature.

Referring to FIGS. 1, 2, 3, and 4, a first box B1 shows a temperature condition for a set operation, and a second box B2 shows a temperature condition for a reset operation. As can be seen from the first box B1, when a first temperature TP1 is applied to a phase change element during a first time interval TI1, the phase change element is programmed to a set state and has a large resistance.

As can be seen from the second box B2, when a second temperature TP2 lower than the first temperature TP1 is applied to the phase change element during a second time interval TI2 longer than the first time interval TI1, the phase change element is programmed to a reset state and has a small resistance.

To provide a temperature to phase change elements of selected memory cells, the word line drive block 120 may apply the word line current IWL to the selected memory cells. For example, in the set operation, the word line drive block 120 may apply the word line current IWL, the first amount of which is able to cause the first temperature TP1 during the first time interval TI1, to the selected memory cells through a selected word line.

In the reset operation, the word line drive block 120 may apply the word line current IWL, the second amount of which is able to cause the second temperature TP2 during the second time interval T12, to the selected memory cells through the selected word line.

When a load exists, a power that is consumed by the load is defined by Equation 1.

$$P=IR^2 \quad \text{[Equation 1]}$$

In Equation 1, "P" indicates a power, "I" indicates a current, and "R" indicates a resistance value of the load. Because the consumption of the power generates heat, a temperature of a phase change element of a selected memory cell is proportional to a square of a resistance value of the phase change element.

As described with reference to FIG. 3, the spaces of the phase change elements vary depending on a distance from the substrate SUB or a height in the third direction. For example, the spaces of the phase change elements close to the substrate SUB are larger than the spaces of the phase change elements far front the substrate SUB. The resistance values of the phase change elements decrease as the distance from the substrate SUB or the height in the third direction increases. In addition, the resistance values of the phase change elements increase as the distance from the substrate SUB or the height in the third direction decreases.

When all of the phase change elements are in a reset state, the resistance values of the phase change elements according to the distance from the substrate SUB or the height in the third direction may vary as described above. When all of the phase change elements are in a set state, the resistance values of the phase change elements according to the distance from the substrate SUB or the height in the third direction may vary as described above.

The word line current that enables the set operation and the reset operation to be successfully performed on phase change elements corresponding to the eighth conductive material CM8 or the sixteenth conductive material CM16 may cause excessive heat generation of phase change elements corresponding to the first conductive material CM1 or the ninth conductive material CM9.

In addition, the word line current IWL that enables the set operation and the reset operation to be successfully performed on the phase change elements corresponding to the first conductive material CM1 or the ninth conductive material CM9 may cause low or no heat generation of the phase change elements corresponding to the eighth conductive material CM8 or the sixteenth conductive material CM16.

Thus, the amount of the word line current IWL that makes it possible to successfully determine the set state and the reset state of the phase change elements corresponding to the first conductive material CM1 or the ninth conductive material CM9 may be different from the amount of the word line current IWL that makes it possible to successfully determine the set state and the reset state of the phase change elements corresponding to the eighth conductive material CM8 or the sixteenth conductive material CM16.

Figure 5:
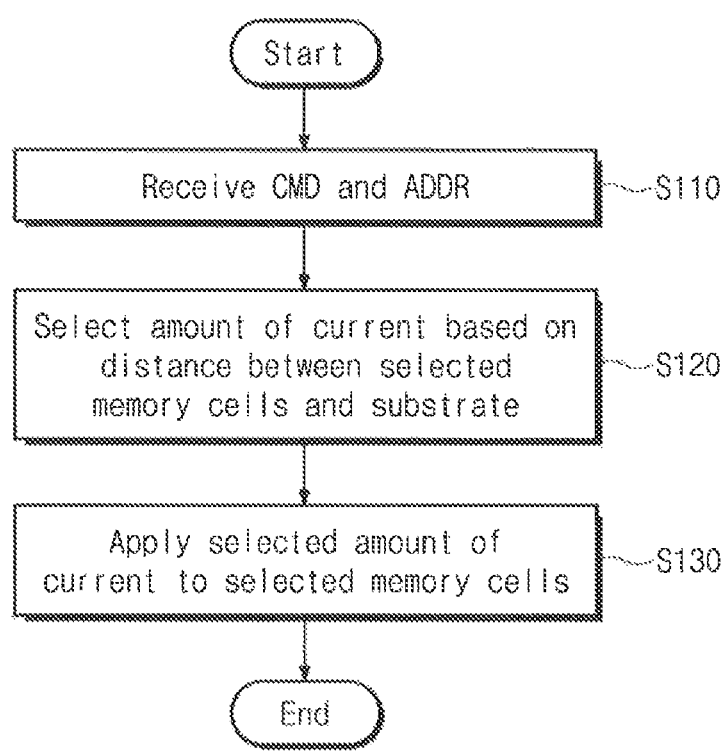
FIG. 5 is a flowchart illustrating an operating method of a nonvolatile memory device according to an exemplary embodiment of the inventive concept.

FIG. 5 is a flowchart illustrating an operating method of the nonvolatile memory device 100 according to an exemplary embodiment of the inventive concept. Referring to FIGS. 1 and 5, in operation S110, the control logic block 150 may receive the command CMD and the address ADDR from an external device. The command CMD may include a command for the set operation, the reset operation, and/or the read operation.

In operation S120, the control logic block 150 may determine a distance between selected memory cells, which the address ADDR indicates, and the substrate SUB. For example, the control logic block 150 may determine a height of the selected memory cells in the third direction. In addition, the control logic block 150 may determine the size of the selected memory cells, or the cross-sectional area of a bit line). The control logic block 150 may control the variable current supply block 140 with the level signal LS such that the amount of the word line current IWL is adjusted based on the distance between the selected memory cells and the substrate SUB (or the height in the third direction, the size of memory cells, or the cross-sectional area of a bit line).

For example, the control logic block. 150 may store the address ADDR and the amount of the word line current IWL (e.g., the amount of current to be applied to the selected memory cells) in an operating mode (e.g., a set operation, a reset operation, and/or a read operation) in a look-up table. The control logic block 150 may control the variable current supply block 140 based on the address ADDR and the look-up table.

In operation S130, the variable current supply block 140 may output the word line current IWL having the adjusted amount under control of the control logic block 150. The word line drive block 120 may apply the word line current IWL having the adjusted amount to the selected memory cells through a selected word line.

Figure 6:
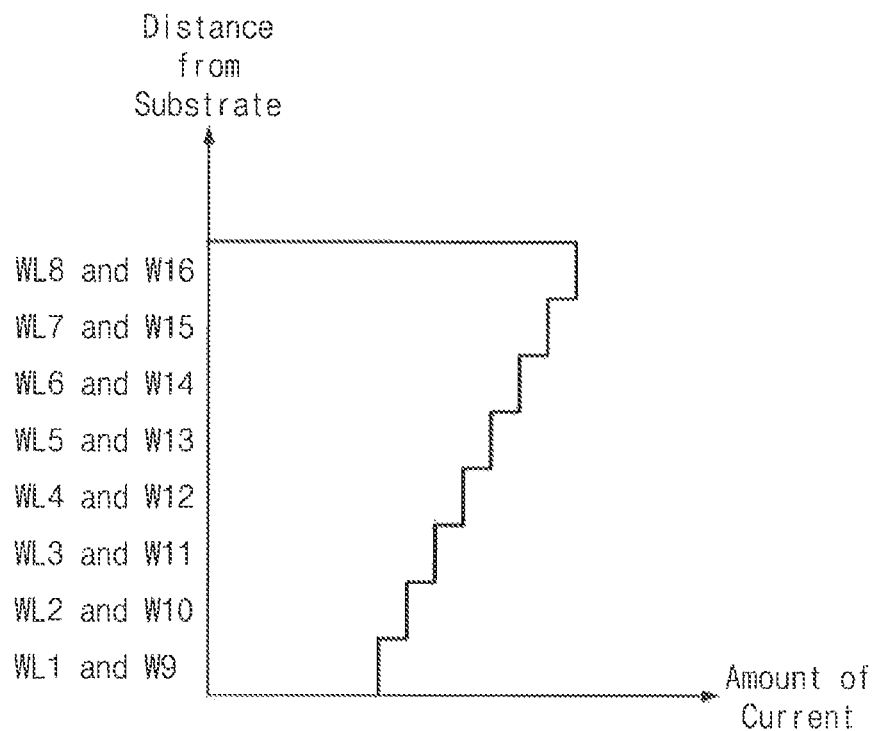
FIG. 6 illustrates a word line drive block adjusting the amount of word Lina current according to an exemplary embodiment of the inventive concept.

FIG. 6 illustrates the word line drive block 140 adjusting the amount of the word line current IWL according to an exemplary embodiment of the inventive concept. In FIG. 6, a horizontal axis indicates the amount of current, and a vertical axis indicates a distance from the substrate SUB (or a height in the third direction).

Referring to FIGS. 1, 2, 3, and 6, as a distance from the substrate SUB (or a height in the third direction) increases, the size of the memory cell MC decreases, and the cross-sectional area of each of the first to fourth bit lines BL1 to BL4 increases. The variable current supply block 140 may increase the amount of the word line current IWL when there is an increase in the distance from the substrate SUB (or the height in the third direction). The variable current supply block 140 may decrease the amount of the word line current IWL when there is a decrease the distance from the substrate SUB (or the height in the third direction).

For example, the variable current supply block 140 may increase the amount of the word line current IWL in units of 10 uA to 200 uA when there are increases the distance from the substrate SUB (or the height in the third direction). The variable current supply block 140 may decrease the amount of the word line current IWL in units of 10 uA to 200 uA when there are decreases the distance from the substrate SUB (or the height in the third direction).

Figure 7:
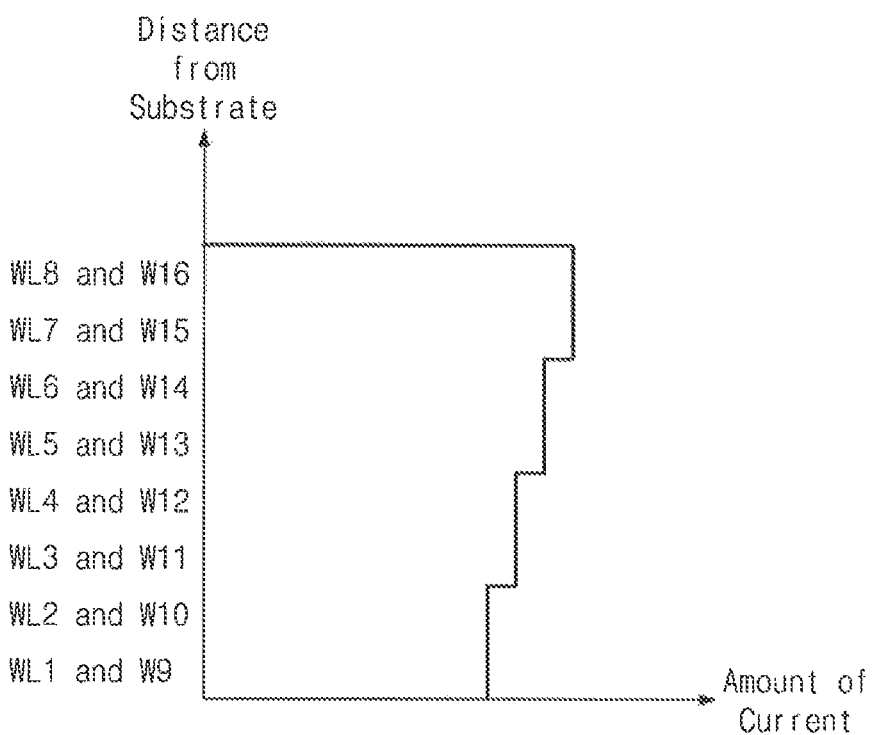
FIG. 7 illustrates a word line drive block adjusting the amount of word line current according to an exemplary embodiment of the inventive concept.

FIG. 7 illustrates another example in which the word line drive block 140 adjusts the amount of the word line current IWL. In FIG. 7, a horizontal axis indicates the amount of current, and a vertical axis indicates a distance from the substrate SUB (or a height in the third direction).

Referring to FIGS. 1, 2, 3, and 7, as a distance from the substrate SUB (or a height in the third direction) increases, the size of the memory cell MC decreases, and the cross-sectional area of each of the first to fourth bit lines BL1 to BL4 increases. The control logic block 150 may pair two word lines having different distances from the substrate SUB (or different heights in the third direction). For example, the control logic block 150 may pair the word lines WL7 and WL8.

When one of word lines belonging to the same pair is selected, the variable current supply block 140 may adjust the amount of the word line current IWL applied to the selected word line equally. In other words, the variable current supply block 140 may adjust the amount of the word line current IWL applied to the paired word lines to be the same. For example, the word lines WL7 and WL8 may be applied with the same amount of word line current IWL. It is to be understood that although the above description is given with reference to two paired word lines, the number of word lines included in one pair (or one group) can be two or more.

Figure 8:
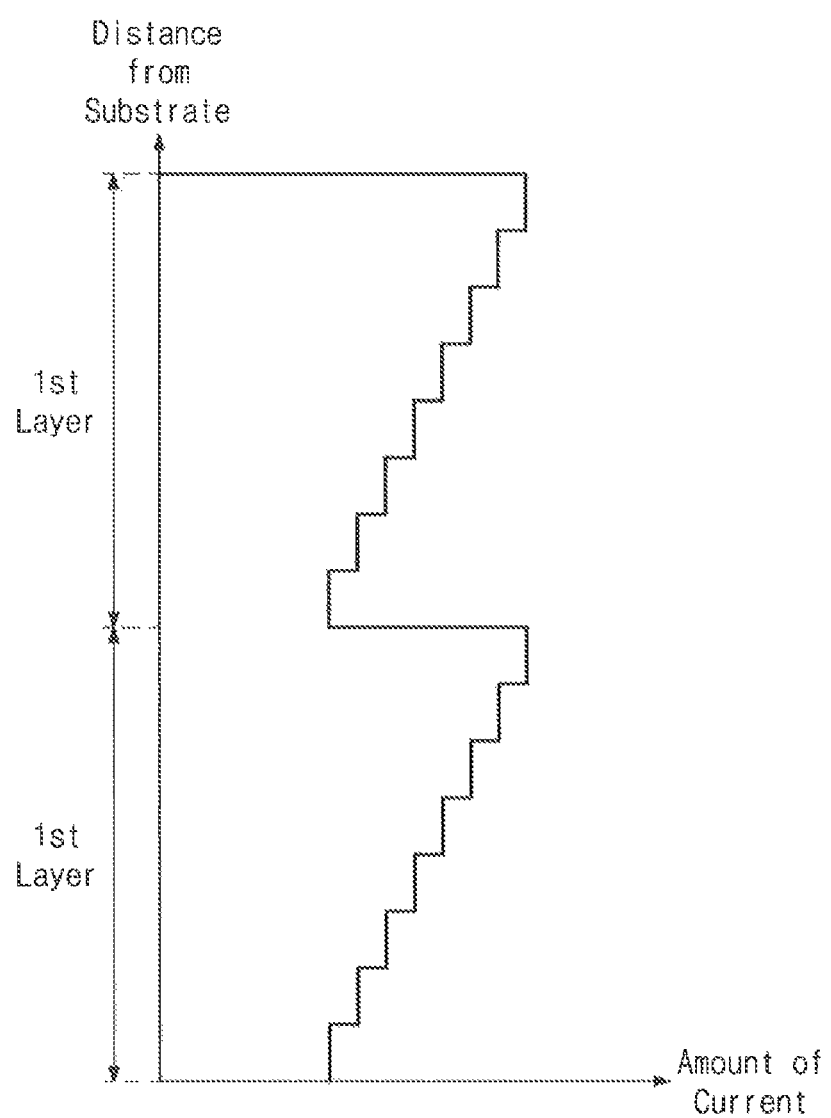
FIG. 8 illustrates a word line drive block adjusting the amount of word line current according to an exemplary embodiment of the inventive concept.

FIG. 8 illustrates another example in which the word line drive block 140 adjusts the amount of the word line current IWL. In FIG. 8, a horizontal axis indicates the amount of current, and a vertical axis indicates a distance from the substrate SUB (or a height in the third direction).

Referring to FIGS. 1, 2, 3, and 8, the memory cell array 110 may be manufactured in a multi-layer structure. For example, in FIG. 3, the structure disposed on the substrate SUB may be a first layer. A structure that is the same as the first structure disposed on the substrate SUB in FIG. 3 may be disposed on the first structure to form a second layer. In this embodiment of the inventive concept, as a distance from the substrate SUB (or a height in the third direction) increases, the size of the memory cell MC decreases, and the cross-sectional area of each of the first to fourth bit lines BL1 to BL4 increases. In the first layer, the variable current supply block 140 may increase the amount of the word line current when there is an increase a distance from the substrate SUB (or a height in the third direction).

In the area where the distance from the substrate SUB (or the height in the third direction) changes from the first layer to the second layer, the cross-sectional area of each of the bit lines BL1 to BL4 decreases (at the bottom of the second layer), and the size of the memory cell MC increases (at the bottom of the second layer). The variable current supply block 140 may decrease the amount of the word line current IWL when the distance from the substrate SUB (or the height in the third direction) changes from the first layer to the second layer.

In the second layer, as the distance from the substrate SUB (or the height in the third direction) increases, the size of the memory cell MC decreases, and the cross-sectional area of each of the first to fourth bit lines BL1 to BL4 increases, in the second layer, the variable current supply block 140 may increase the amount of the word line current IWL as the distance from the substrate SUB (or the height in the third direction) increases.

For example, the embodiment of FIG. 7 in which two or more word lines are paired (or grouped) may be applied to the embodiment of FIG. 8.

Figure 9:
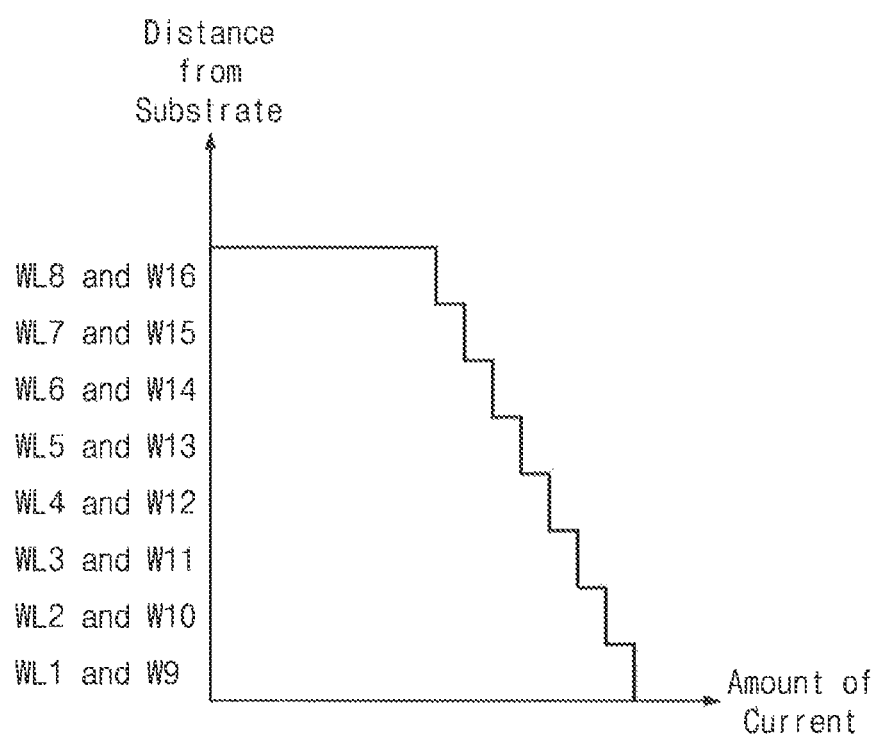
FIG. 9 illustrates a word line drive block adjusting the amount of word line current according to an exemplary embodiment of the inventive concept.

FIG. 9 illustrates another example in which the word line drive block 140 adjusts the amount of the word line current IWL. In FIG. 9, a horizontal axis indicates the amount of current, and a vertical axis indicates a distance from the substrate SUB (or a height in the third direction).

Referring to FIGS. 2, 3, and 9, while the memory cell array 110 is manufactured, a process of injecting a phase change material may be performed during a given time. In the process of injecting the phase change material, the phase change material may be injected through the spaces for the vertical conductive materials VCM1 to VCM4.

As a distance from the substrate SUB (or a height in the third direction) decreases, the phase change material may not be sufficiently injected into spaces for the phase change elements. Accordingly, when the process of injecting the phase change material is performed during a given time, the size of the phase change element may decrease as the phase change element becomes closer to the substrate SUB.

Accordingly, as the distance from the substrate SUB (or the height in the third direction) or the cross-sectional area of each of the bit lines BL1 to BL4 increases, resistance values of the phase change elements increase. In addition, as the distance from the substrate SUB (or the height in the third direction) or the cross-sectional area of each of the bit lines BL1 to BL4 decreases, the resistance values of the phase change elements decrease.

Accordingly, as illustrated in FIG. 9, the variable current supply block 140 may decrease the amount of the word line current IWL as the distance from the substrate SUB (or the height in the third direction) or the cross-sectional area of each of the bit lines BL1 to BL4 increases. The variable current supply block 140 may increase the amount of the word line current IWL as the distance from the substrate SUB (or the height in the third direction) or the cross-sectional area of each of the bit lines BL1 to BL4 decreases.

For example, the embodiment of FIG. 7 in which two or more word lines are paired (or grouped) may be applied to the embodiment of FIG. 9. In addition, the embodiment of FIG. 8 in which the amount of the word line current IWL is adjusted depending on layers may be applied to the embodiment of FIG. 9.

The above descriptions are given with reference to FIGS. 6 to 9 as the variable current supply block 140 adjusts the amount of the word line current IWL depending on the distance from the substrate SUB (or the height in the third direction). However, the variable current supply block 140 may adjust the amount of the word line current IWL depending on the cross-sectional area of each of the first to fourth bit lines BL1 to BL4 or the size of the memory cell MC (or the phase change element). Moreover, the inventive concept is not limited thereto.

Figure 10:
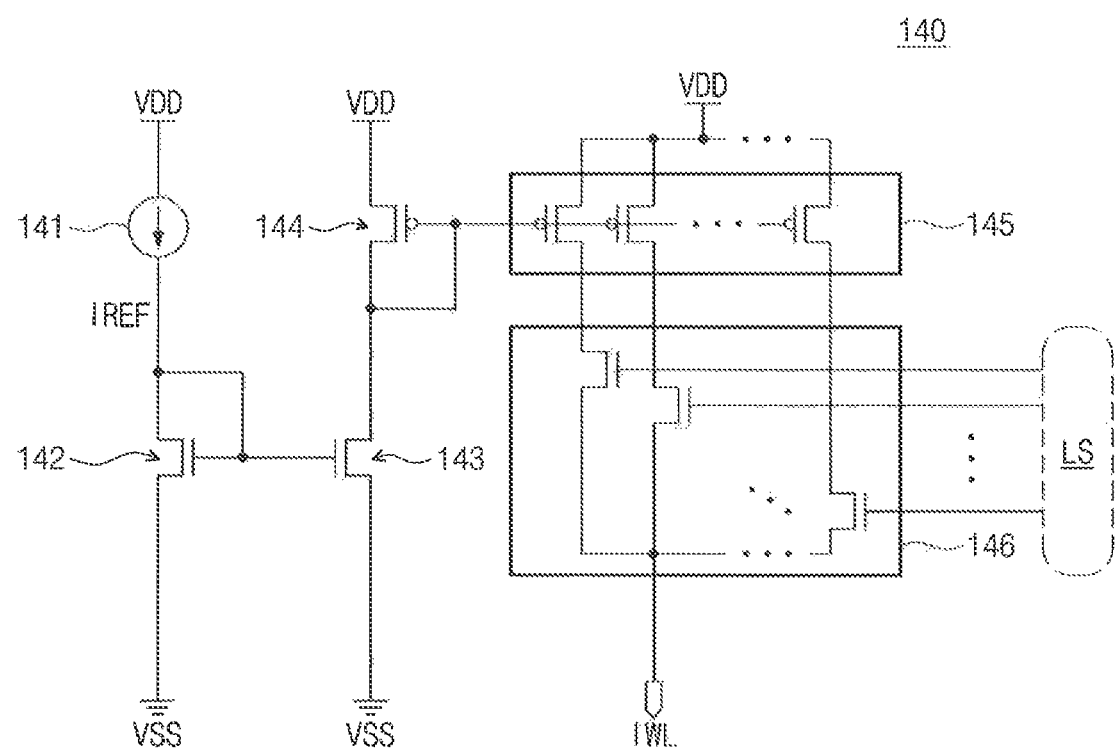
FIG. 10 is a diagram illustrating a variable current supply block of FIG. 1 according to an exemplary embodiment of the inventive concept.

FIG. 10 is a diagram illustrating the variable current supply block 140 of FIG. 1 according to an exemplary embodiment of the inventive concept. Referring to FIGS. 1 and 10, the variable current supply block 140 may include a reference current generator 141, first, second and third transistors 142, 143 and 144, a current output block 145, and a variable block 146.

The reference current generator 141 is connected to a power node to which a power supply voltage VDD is supplied. The reference current generator 141 generates and outputs a reference current IREF. The first transistor 142 is connected between the reference current generator 141 and a ground node to which a ground voltage VSS is supplied. A gate of the first transistor 142 may be connected to the reference current generator 141. The first transistor 142 may transfer a voltage (e.g., a first voltage) generated by the reference current IREF and the first transistor 142 to the second transistor 143.

The second transistor 143 may be connected between the third transistor 144 and the ground node. The second transistor 143 may receive the first voltage from the first transistor 142. Based on the first voltage, the second transistor 143 may drain a current (e.g., a first current) corresponding to the reference current IREF. In other words, the reference current IREF may be mirrored to the first current by the first and second transistors 142 and 143.

The third transistor 144 is connected between the power node and the second transistor 143. A gate of the third transistor 144 is connected to the second transistor 143. The third transistor 144 may transfer a voltage (e.g., a second voltage), which is generated by the first current and the third transistor 144, to the current output block 145.

The current output block 145 is connected between the power node and the variable block 146. The current output block 145 may include a plurality of p-type metal oxide semiconductor (PMOS) transistors that receive the second voltage from the third transistor 144 in common. The plurality of PMOS transistors, when activated, may drain sub-currents corresponding to the first current, respectively. A sum of the sub-currents may be the second current. In other words, the first current may be mirrored to the second current by the third transistor 144 and the current output block 145.

The variable block 146 is connected between an output node outputting the word line current and the current output block 145. The variable block 146 may include a plurality of n-type metal oxide semiconductor (NMOS) transistors that operate in response to the level signal LS and are respectively connected to the plurality of PMOS transistors. When one of the plurality of NMOS transistors is turned on, the corresponding PMOS transistor may be activated. In other words, the variable block 146 may adjust the amount of the second current to output the word line current IWL.

In an exemplary embodiment of the inventive concept, the amount of sub-current flowing through each of the plurality of PMOS transistors in the current output block 145 may vary with the size of the corresponding PMOS transistor, for example, a width of a channel thereof. For example, as the size of a PMOS transistor becomes larger, the amount of current may increase, In addition, as the size of the PMOS transistor becomes smaller, the amount of current may decrease.

The plurality of PMOS transistors may be designed depending on the way to adjust the amount of the word line current IWL. For example, when the amount of the word line current IWL is adjusted in a first way, the plurality of PMOS transistors may have the same size. When the amount of the word line current Mt is adjusted in a second way, the plurality of PMOS transistors may have different sizes. For example, the sizes of the plurality of PMOS transistors may be sequentially doubled.

NMOS transistors and PMOS transistors are illustrated in FIG. 10, However, different kinds of transistors may be used in the variable current supply block 140.

As described above, the nonvolatile memory device 100 according to an exemplary embodiment of the inventive concept may adjust the amount of the word line current IWL based on characteristics in which a resistance value of a phase change element varies as a distance from the substrate SUB, a height in the third direction, the size of the memory cells MC, or the cross-sectional area of each of the bit lines BL varies. Accordingly, reliability of the memory cells MC disposed in the three-dimensional structure may be increased.

In the above described embodiments, components are described by using blocks. The blocks may be implemented with various hardware devices, such as an integrated circuit (IC), an application specific IC (ASIC), a field programmable gate array (FPGA), and a complex programmable logic device (CPLD), firmware driven in hardware devices, software such as an application, or a combination of a hardware device and software. In addition, the blocks may include circuits embodied as circuits or intellectual property (IP) implemented with semiconductor elements in an integrated circuit.

According to exemplary embodiments of the inventive concept, the amount of current to be applied to a word line is adjusted depending on a distance between the word line and a substrate, the cross-sectional area of a bit line, or the size of a memory cell. Accordingly, a nonvolatile memory device that prevents the reduction of reliability in memory cells arranged in a three-dimensional structure is provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A nonvolatile memory device, comprising:
a memory cell array including a first group of memory cells and a second group of memory cells;
a word line drive block connected to the first group of memory cells through a first group of word lines and to the second group of memory cells through a second group of word lines;
a bit line bias and sense block connected to the first group of memory cells and the second group of memory cells through bit lines;
a variable current supply block configured to generate a word line current to be supplied to a word line selected from the first group of word lines or the second group of word lines; and
a control logic block configured to receive an address and a command from an external host device and to control the variable current supply block to adjust an amount of the word line current based on the address,
wherein the memory cell array includes:
a substrate including an upper surface corresponding to a plane defined by a first direction and a second direction;
vertical conductive materials spaced from each other along the second direction, wherein the vertical conductive materials extend in a third direction perpendicular to the first direction and the second direction, and correspond to the bit lines;
first insulating layers and first memory cells stacked along the third direction on first side surfaces of the vertical conductive materials;
first conductive materials extending along the second direction on first side surfaces of the first memory cells, wherein the first conductive materials correspond to the first group of word lines;
second insulating layers and second memory cells stacked along the third direction on second side surfaces of the vertical conductive materials; and
second conductive materials extending along the second direction on second side surfaces of the second memory cells, wherein the second conductive materials correspond to the second group of word lines, and
wherein the control logic block is further configured to vary the amount of the word line current depending on a distance between the selected word line and the substrate.

2. The nonvolatile memory device of claim 1, wherein the control logic block increases the amount of the word line current as the distance between the selected word line and the substrate increases.

3. The nonvolatile memory device of claim 1, wherein the control logic block decreases the amount of the word line current as the distance between the selected word line and the substrate decreases.

4. The nonvolatile memory device of claim 1, wherein the control logic block pairs at least two word lines having different distances from the substrate from among the first group of word lines, and
wherein the control logic block applies the amount of the word line current equally to the at least two word lines.

5. The nonvolatile memory device of claim 1, wherein the first group of word lines are divided into a first layer of word lines and a second layer of word lines,
wherein, when the selected word line is in the first layer, the control logic block increases the amount of the word line current as the distance between the selected word line and the substrate increases,
wherein, when the selected word line is in the second layer, the control logic block increases the amount of the word line current as the distance between the selected word line and the substrate increases, and
wherein a first amount of the word line current when the selected wordline is near an uppermost portion of the first layer is greater than a second amount of the word line current when the selected wordline is near a lowermost portion of the second layer.

6. The nonvolatile memory device of claim 1, wherein the first group of word lines are divided into a first layer of word lines and a second layer of word lines,
wherein, when the selected wordline is in the first layer, the control logic block decreases the amount of the word line current as the distance between the selected word line and the substrate increases,
wherein, when the selected wordline is in the second layer, the control logic block decreases the amount of the word line current as the distance between the selected word line and the substrate increases, and
wherein a first amount of the word line current when the selected wordline is near an uppermost portion of the first layer is smaller than a second amount of the word line current when the selected wordline is near a lowermost portion of the second layer.

7. The nonvolatile memory device of claim 1, wherein the variable current supply block includes:
a reference current generator configured to output a reference current;
a first transistor configured to output a first voltage generated by the reference current;
a second transistor configured to drain a first current corresponding to the reference current, in response to the first voltage;
a third transistor configured to output a second voltage generated by the first current;
a current output block configured to drain sub-currents corresponding to the first current, in response to the second voltage; and
a variable block configured to adjust an amount of the second current under control of the control logic Hock and to output the word line current as a result of the adjustment.

8. The nonvolatile memory device of claim 7, wherein the current output block includes:
first transistors configured to drain the sub-currents corresponding to the first current, in response to the second voltage.

9. The nonvolatile memory device of claim 8, wherein the first transistors have a same size.

10. The nonvolatile memory device of claim 8, wherein sizes of the first transistors are sequentially doubled.

11. The nonvolatile memory device of claim 8, wherein the variable Hock includes:
second transistors respectively connected to the first transistors, and configured to transfer or block the sub-currents under control of the control logic block.

12. The nonvolatile memory device of claim 1, herein each of the first group of memory cells and the second group of memory cells includes a phase change element, a harrier element, and a selection element connected between a corresponding word line and a corresponding bit line.

13. The nonvolatile memory device of claim 12, wherein the selection element includes an ovonic threshold switching (OTS) material, a chalcogenide switching material, an oxide diode, a silicon diode, or a transition metal oxide.

14. The nonvolatile memory device of claim 12, wherein the phase change element includes a chalcogen compound, a perovskite compound, or a conductive metal oxide.

15. A nonvolatile memory device, comprising:
a memory cell array including a first group of memory cells and a second group of memory cells;
a word line drive block connected to the first group of memory cells through a first group of word lines and to the second group of memory cells through a second group of word lines;
a bit line bias and sense block connected to the first group of memory cells and the second group of memory cells through bit lines;
a variable current supply block configured to generate a word line current to be supplied to a word line selected from the first group of word lines or the second group of word lines; and
a control logic block configured to receive an address and a command from a host device and to control the variable current supply block to adjust an amount of the word line current based on the address,
wherein the memory cell array includes:
a substrate including an upper surface corresponding to a plane defined by a first direction and a second direction;
vertical conductive materials spaced from each other along the second direction, wherein the vertical conductive materials extend in a third direction perpendicular to the first direction and the second direction, and correspond to the bit lines;
first insulating layers and first memory cells alternately stacked along the third direction on first side surfaces of the vertical conductive materials;
first conductive materials extending along the second direction on first side surfaces of the first memory cells, wherein the first conductive materials correspond to the first group of word lines;
second insulating layers and second memory cells alternately stacked along the third direction on second side surfaces of the vertical conductive materials; and
second conductive materials extending along the second direction on second side surfaces of the second memory cells, wherein the second conductive materials correspond to the second group of word lines, and
wherein the control logic block is further configured to vary the amount of the word line current depending on a cross-sectional area of at least one of the bit lines disposed at a same height as the selected word line.

16. The nonvolatile memory device of claim 15, wherein the control logic block increases the amount of the word line current as the cross-sectional area increases.

17. The nonvolatile memory device of claim 15, wherein the control logic block decreases the amount of the word line current as the cross-sectional area increases.

18. The nonvolatile memory device of claim 15, wherein the control logic block varies the amount of the word line current in units of 10 uA to 200 uA.

19. A nonvolatile memory device, comprising:
- a memory cell array including a first group of memory cells and a second group of memory cells;
- a word line drive block connected to the first group of memory cells through a first group of word lines and to the second group of memory cells through a second group of word lines;
- a bit line bias and sense block connected to the first group of memory cells and the second group of memory cells through bit lines;
- a variable current supply block configured to generate a word line current to be supplied to a word line selected from the first group of word lines or the second group of word lines; and
- a control logic block configured to receive an address and a command from a host device and to control the variable current supply block to adjust an amount of the word line current based on the address,
- wherein the memory cell array includes:
- a substrate including an upper surface arranged in a first direction and a second direction;
- vertical conductive materials spaced from each other along the second direction, wherein the vertical conductive materials extend in a third direction perpendicular to the first direction and the second direction, and correspond to the bit lines;
- first insulating layers and first memory cells stacked along the third direction on first side surfaces of the vertical conductive materials;
- first conductive materials extending along the second direction on first side surfaces of the first memory cells, wherein the first conductive materials correspond to the first group of word lines;
- second insulating layers and second memory cells stacked along the third direction on second side surfaces of the vertical conductive materials; and
- second conductive materials extending along the second direction on second side surfaces of the second memory cells, wherein the second conductive materials correspond to the second group of word lines, and
- wherein the control logic block is further configured to vary the amount of the word line current depending on a size of the memory cells connected to the selected word line.

20. The nonvolatile memory device of claim 19, wherein the size of the memory cells varies depending on a distance between the selected word line and the substrate.

* * * * *